(12) United States Patent
Chen et al.

(10) Patent No.: US 11,133,246 B1
(45) Date of Patent: Sep. 28, 2021

(54) SEMICONDUCTOR STRUCTURE EMPLOYING CONDUCTIVE PASTE ON LEAD FRAME

(71) Applicant: Vanguard International Semiconductor Corporation, Hsinchu (TW)

(72) Inventors: Chih-Yen Chen, Tainan (TW); Hsin-Chang Tsai, Kaohsiung (TW); Chun-Yi Wu, Taichung (TW); Chia-Ching Huang, Taoyuan (TW); Chih-Jen Hsiao, Jhuangwei Township (TW); Wei-Chan Chang, Taoyuan (TW); Francois Hebert, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 16/827,953

(22) Filed: Mar. 24, 2020

(51) Int. Cl.
*H01L 23/498* (2006.01)
*H01L 23/15* (2006.01)

(52) U.S. Cl.
CPC ........ *H01L 23/49844* (2013.01); *H01L 23/15* (2013.01); *H01L 23/49883* (2013.01)

(58) Field of Classification Search
CPC .............................................. H01L 23/49844
USPC ....................................................... 257/773
See application file for complete search history.

(56) References Cited

U.S. PATENT DOCUMENTS

| | | | |
|---|---|---|---|
| 2002/0055246 A1* | 5/2002 | Jiang | H01L 24/06 438/597 |
| 2005/0006742 A1 | 1/2005 | Sugiyama et al. | |
| 2006/0231934 A1* | 10/2006 | Risaki | H01L 24/83 257/676 |
| 2011/0233758 A1 | 9/2011 | Machida et al. | |
| 2015/0171053 A1 | 6/2015 | Tani et al. | |
| 2016/0118490 A1* | 4/2016 | Padmanabhan | H01L 21/8258 257/195 |
| 2019/0363090 A1* | 11/2019 | Reznicek | H01L 21/02532 |

OTHER PUBLICATIONS

Taiwanese Office Action and Search Report dated May 13, 2020 for Application No. 108145469.

* cited by examiner

*Primary Examiner* — Ajay Arora
(74) *Attorney, Agent, or Firm* — Birch, Stewart, Kolasch & Birch LLP

(57) ABSTRACT

A semiconductor structure is provided. The semiconductor structure includes a base, a seed layer, a compound semiconductor layer, a gate structure, a source structure, a drain structure, and a conductive paste. The seed layer is disposed on the base. The compound semiconductor layer is disposed on the seed layer. The gate structure is disposed on the compound semiconductor layer. The source structure and the drain structure are disposed on both sides of the gate structure. In addition, the conductive paste is disposed between the base and a lead frame, and the conductive paste extends to the side surface of the base.

20 Claims, 3 Drawing Sheets

SEMICONDUCTOR STRUCTURE EMPLOYING CONDUCTIVE PASTE ON LEAD FRAME

BACKGROUND OF THE DISCLOSURE

Field of the Disclosure

The present disclosure relates to a semiconductor structure, and in particular it relates to a semiconductor structure having a conductive paste on its side surface.

Description of the Related Art

Gallium nitride-based (GaN-based) semiconductor materials have many excellent material characteristics, such as high thermal resistance, wide band-gap, high electron saturation rate and so on. Therefore, gallium nitride-based semiconductor materials are suitable for high-speed and high-temperature operating environments. In recent years, gallium nitride-based semiconductor materials have been widely used in light-emitting diode (LED) elements and high-frequency elements, such as high electron mobility transistors (HEMTs) with heterogeneous interface structures.

However, in the operation of a high-electron-mobility transistor (HEMT) device, many negatively charged impurities exist in the epitaxial layer located at the bottom of the structure of the element due to the material characteristics of the epitaxial layer. When a high voltage is applied, the negative charges will be attracted toward the upper layer of the element, which will affect the operation of the upper layer of the element. Using techniques that currently exist, this problem can be solved by grounding the silicon substrate that is located below the epitaxial layer to discharge negative charges of the impurities, or by providing a through-GaN-via.

Although the high-electron-mobility transistor devices manufactured using current manufacturing techniques have been adequate for their intended purposes, they have not been entirely satisfactory in all respects. The development of structures and manufacturing methods that can further improve the efficiency and reliability of high electron mobility transistors is still one of the goals that the industry is aiming at.

BRIEF SUMMARY OF THE DISCLOSURE

In accordance with some embodiments of the present disclosure, a semiconductor structure is provided. The semiconductor structure includes a base, a seed layer, a compound semiconductor layer, a gate structure, a source structure, a drain structure, and a conductive paste. The seed layer is disposed on the base. The compound semiconductor layer is disposed on the seed layer. The gate structure is disposed on the compound semiconductor layer. The source structure and the drain structure are disposed on both sides of the gate structure. In addition, the conductive paste is disposed between the base and a lead frame, and the conductive paste extends to the side surface of the base.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF THE DISCLOSURE

Figure 1:
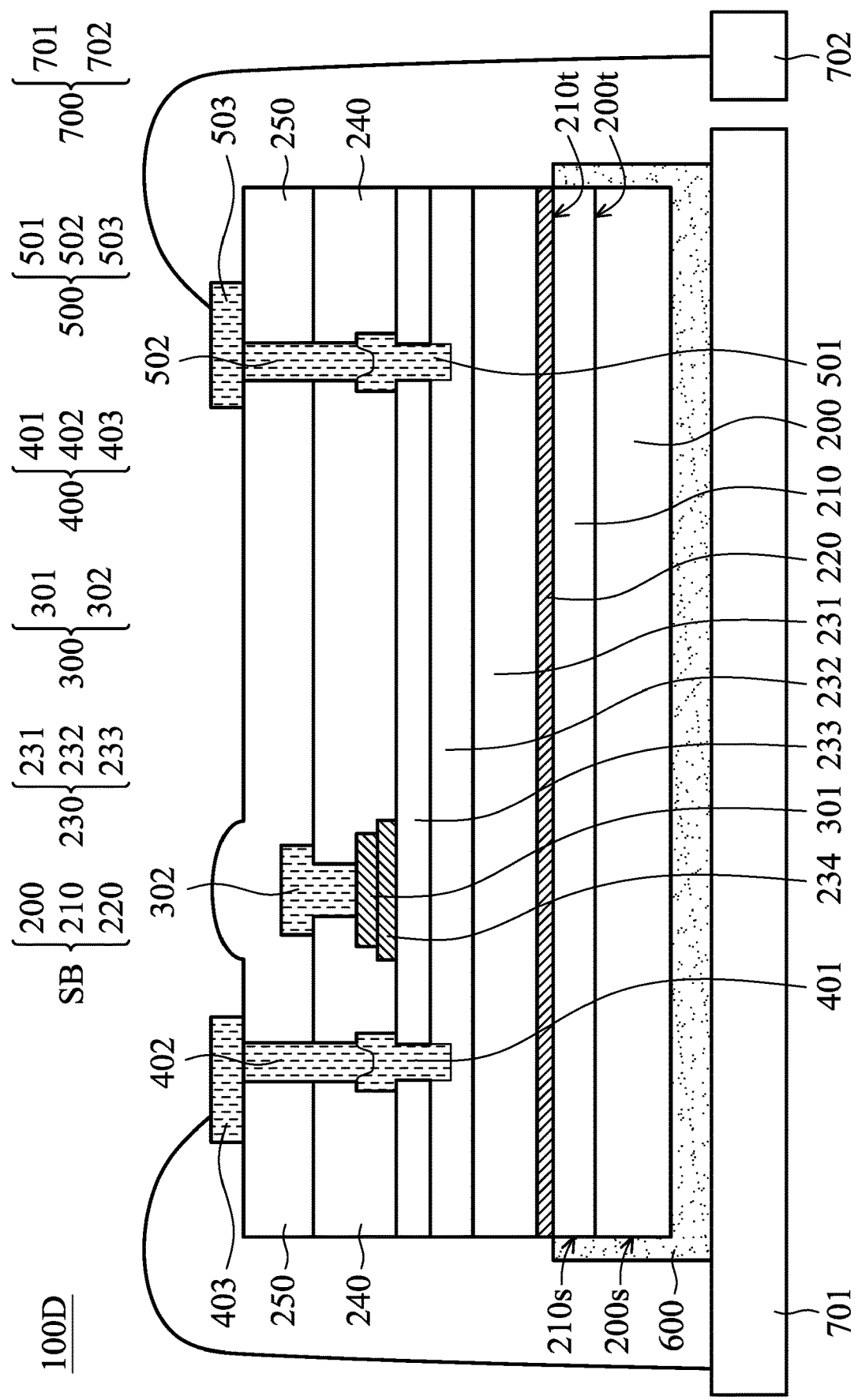
FIG. 1 is a cross-sectional diagram of a semiconductor structure in accordance with some embodiments of the present disclosure.

The semiconductor structure provided in the embodiments of the present disclosure is described in detail in the following description. It should be understood that the following description provides many different embodiments or examples for implementing different aspects of some embodiments of the present disclosure. The specific elements and configurations described in the following detailed description are set forth in order to clearly describe the present disclosure. It will be apparent that the exemplary embodiments set forth herein are used merely for the purpose of illustration. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure. It should be understood that the elements or devices in the drawings of the present disclosure may be present in any form or configuration known to those with ordinary skill in the art. In addition, in the embodiments, relative expressions are used. For example, "lower", "bottom", "higher" or "top" are used to describe the position of one element relative to another. It should be appreciated that if a device is flipped upside down, an element that is "lower" will become an element that is "higher".

In addition, the expressions "a first material layer is disposed on or over a second material layer" may indicate that the first material layer is in direct contact with the second material layer, or that the first material layer is not in direct contact with the second material layer, there being one or more intermediate layers disposed between the first material layer and the second material layer.

Moreover, the terms "about" or "substantially" typically means +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, the provided semiconductor structure includes the conductive paste extending on the side surfaces of the base and the buried oxide layer and in contact with the base and the buried oxide layer, thereby reducing the capacitance value at the bottom of the base. In accordance with some embodiments of the present disclosure, the conductive paste may further extend to the side surface of the seed layer and in contact the seed layer, so that the seed layer may be electrically grounded, thereby improving the operational stability of the semiconductor structure. In addition, in accordance with some embodiments of the present disclosure, it is not necessary to provide a through-GaN-via in the substrate of the semiconductor structure, thereby increasing the breakdown voltage of the semiconductor structure and allowing the semiconductor elements being used for high voltage operation.

FIG. 1 is a cross-sectional diagram of a semiconductor structure 100D in accordance with some embodiments of the present disclosure. It should be understood that, in accordance with some embodiments, additional features may be added to the semiconductor structure 100D. In some embodiments, some features of the semiconductor structure 100D described below may be replaced or omitted.

Referring to FIG. 1, in accordance with some embodiments, the semiconductor structure 100D may include a base 200, a seed layer 220 disposed on the base 200, a compound semiconductor layer 230 disposed on the seed layer 220, a gate structure 300 disposed on the compound semiconductor layer 230, a source structure 400 and a drain structure 500 disposed on both sides of the gate structure 300, and a conductive paste 600 disposed between the base 200 and a lead frame 700.

As shown in FIG. 1, in accordance with some embodiments, the semiconductor structure 100D may further include a buried oxide (BOX) layer 210, and the base 200, the buried oxide layer 210 and the seed layer 220 may be collectively referred to as a substrate SB.

In some embodiments, the base 200 may have an active region (not illustrated) and an isolation region (not illustrated). In some embodiments, the base 200 may include a ceramic base or a silicon base. In some embodiments, the base 200 may be an insulating base. In some embodiments, the material of the ceramic base may include aluminum nitride (AlN), silicon carbide (SiC), aluminum oxide ($Al_2O_3$), other suitable materials, or a combination thereof. In some embodiments, the ceramic powder may be sintered at a high temperature by powder metallurgy to form the aforementioned ceramic base. As described above, in some embodiments, the substrate SB may include the buried oxide layer 210. The substrate SB may be, for example, a semiconductor-on-insulator (SOI) substrate and it is formed by providing the seed layer 220 on the buried oxide layer 210. In some embodiments, the buried oxide layer 210 may encapsulate the ceramic base.

In some embodiments, the thickness of the base 200 may be in a range from about 50 micrometers to about 750 micrometers, for example, about 200 micrometers, but the present disclosure is not limited thereto.

In accordance with some embodiments, the buried oxide layer 210 that is disposed on the base 200 may be a film layer having good thermal stability at high temperatures. In some embodiments, the buried oxide layer 210 may include silicon oxide. For example, the buried oxide layer 210 may be a silicon oxide layer formed of tetraethoxysilane (TEOS). In some embodiments, the buried oxide layer 210 may be a dielectric layer formed by a plasma-enhanced chemical vapor deposition (PECVD) process. For example, the dielectric layer may include silicon oxide, silicon nitride, and silicon oxynitride, silicon carbide, other suitable materials, or a combination thereof.

In accordance with some embodiments, the buried oxide layer 210 may provide a high-quality surface to facilitate subsequent formation of other film layers of the semiconductor structure on its surface. In some embodiments, the thickness of the buried oxide layer 210 may be in a range from about 0.5 micrometers to about 5 micrometers, for example, about 2 micrometers, but the present disclosure is not limited thereto.

In some embodiments, the material of the seed layer 220 that is formed on the buried oxide layer 210 may include silicon, silicon carbide, aluminum nitride, other III-V compound semiconductor materials, other suitable materials, or a combination thereof. In some embodiments, the silicon carbide may be doped silicon carbide (e.g., silicon carbide may be doped with nitrogen or phosphorus to form an n-type semiconductor, or silicon carbide may be doped with aluminum, boron, gallium, or beryllium to form a p-type semiconductor). In some embodiments, the seed layer 220 may be formed by an epitaxial growth process. For example, a metal organic chemical vapor deposition (MOCVD) process, a hydride vapor phase epitaxy (HVPE) process, a molecular beam epitaxy (MBE) process, other suitable processes, or a combination thereof may be used to conformally form the seed layer 220 on the buried oxide layer 210.

In some embodiments, the thickness of the seed layer 220 may be in a range from about 50 nanometers to about 500 nanometers, for example, about 300 nanometers, but the present disclosure is not limited thereto.

In some embodiments, the compound semiconductor layer 230 may be a gallium nitride (GaN)-based semiconductor layer or an aluminum nitride(AlN)-based semiconductor layer. In some embodiments, the material of the GaN-based semiconductor layer may include gallium nitride (GaN), aluminum gallium nitride (AlGaN), indium gallium nitride (InGaN), indium gallium aluminum nitride (InGaAlN), other suitable materials or a combination thereof. In some embodiments, the GaN-based semiconductor layer may include dopants (for example, n-type dopants or p-type dopants) or not include dopants. In some embodiments, the material of the AlN-based semiconductor layer may include aluminum nitride(AlN), indium gallium aluminum nitride (InGaAlN), aluminum indium nitride (AlInN), other suitable materials or a combination thereof. In some embodiments, the AlN-based semiconductor layer may include dopants (for example, n-type dopants or p-type dopants) or not include dopants In some embodiments, the compound semiconductor layer 230 that is formed on the seed layer 220 may include a buffer layer 231 disposed on the seed layer 220, a channel layer 232 disposed on the buffer layer 231, and a channel layer 232 disposed on barrier layer 233.

In accordance with some embodiments, the buffer layer 231 may alleviate the strain of the channel layer 232 that is formed later on the buffer layer 231 to prevent defects from being formed in the channel layer 232 above. The strain may be caused by the mismatch of the channel layer 232 and the base 200. In some embodiments, the material of the buffer layer 231 may include aluminum nitride, gallium nitride (GaN), aluminum gallium nitride ($Al_xGa_{1-x}N$, wherein $0<x<1$), aluminum indium nitride (AlInN), other suitable materials, or a combination thereof. Furthermore, the buffer layer 231 may be formed by an epitaxial growth process, such as a metal organic chemical vapor deposition (MOCVD) process, a hydride vapor phase epitaxy (HVPE) process, a molecular beam epitaxy (MBE) process, or other suitable processes, or a combination thereof.

In some embodiments, the thickness of the buffer layer 231 may be in a range from about 0.3 micrometers to about 30 micrometers, for example, about 5 micrometers, but the present disclosure is not limited thereto. It should be understood that although the buffer layer 231 has a single-layer structure in the embodiment shown in FIG. 1, the buffer layer 231 may have a multi-layer structure in accordance with some other embodiments.

In addition, in some embodiments, two-dimensional electron gas (2DEG) (not illustrated) may be formed on the heterogeneous interface between the channel layer 232 and the barrier layer 233. In accordance with some embodiments, the semiconductor structure 100D may be a high-electron-mobility transistor (HEMT) using two-dimensional electron gas (2DEG) as a conductive carrier. In some embodiments, the material of the barrier layer 233 may include aluminum nitride (AlN), aluminum gallium nitride (AlGaN), aluminum indium nitride (AlInN), aluminum gallium nitride (AlGaN), other suitable materials or a combination thereof. The barrier layer 233 may be a single-layer or multi-layers, and the barrier layer 233 may include dopants (for example, n-type dopants or p-type dopants) or not include dopants. In some embodiments, the channel layer 232 may be a gallium nitride (GaN) layer, and the barrier layer 233 that is formed on the channel layer 232 may be an aluminum gallium nitride (AlGaN) layer, and the gallium nitride layer and the aluminum gallium nitride layer may include dopants (for example, n-type dopants or p-type dopants) or not include dopants. Furthermore, the channel layer 232 and the barrier layer 233 may be formed by an epitaxial growth process, such as a metal organic chemical vapor deposition (MOCVD) process, a hydride vapor phase epitaxy (HVPE) process, a molecular beam epitaxy (MBE) process, other suitable processes, or a combination thereof.

In some embodiments, the thickness of the channel layer 232 may be in a range from about 5 nanometers to about 500 nanometers, for example, about 400 nanometers, but the present disclosure is not limited thereto. In some embodiments, the thickness of the barrier layer 233 may be in a range from about 5 nanometers to about 30 nanometers, for example, about 15 nanometers, but the present disclosure is not limited thereto.

Next, the gate structure 300 may be formed on the compound semiconductor layer 230 (for example, the barrier layer 233), and the source structure 400 and the drain structure 500 may be formed on opposite sides of the gate structure 300. In addition, an inner dielectric layer (for example, a first dielectric layer 240 and a second dielectric layer 250) may be on the compound semiconductor layer 230 to form the semiconductor structure 100D.

As described above, in accordance with some embodiments of the present disclosure, the semiconductor structure 100 may be a high-electron-mobility transistor (HEMT). In some embodiments, the gate structure 300 may include a gate electrode 301 and a gate metal layer 302, the gate electrode 301 may be disposed on the barrier layer 233, and the gate metal layer 302 may be disposed on the gate electrode 301 and electrically connected to the gate electrode 301. In some embodiments, a doped compound semiconductor layer 234 may optionally exist between the gate electrode 301 and the barrier layer 233, and the details of which will be further described later.

In some embodiments, the source structure 400 may include a source electrode 401, a source contact 402 and a source metal layer 403 that are electrically connected to each other, and the drain structure 500 may include a drain electrode 501, a drain contact 502 and a drain metal layer 503 that are electrically connected to each other. In some embodiments, the source electrode 401 and the drain electrode 501 that are located on both sides of the gate electrode 301 both may penetrate through the barrier layer 233 and contact the channel layer 232.

In some embodiments, the source metal layer 403 and the drain metal layer 503 may be electrically connected to the lead frame 700. In some embodiments, the lead frame 700 may be a package metal frame that is used for packaging the semiconductor structure 100D, and the material of the lead frame 700 may include copper (Cu), iron-nickel (NiFe), lead, tin, and gold (Au), nickel (Ni), platinum (Pt), palladium (Pd), iridium (Ir), titanium (Ti), chromium (Cr), tungsten (W), aluminum (Al), stainless, other suitable materials, or a combination thereof. In some embodiments, the lead frame 700 may include a first conductive layer 701 and a second conductive layer 702, and the first conductive layer 701 and the second conductive layer 702 may be any suitable conductive element in the lead frame 700.

In some embodiments, the source metal layer 403 may be electrically connected to the first conductive layer 701 in the lead frame 700, and the drain metal layer 503 may be electrically connected to the second conductive layer 702 in the lead frame 700. In other words, in some embodiments, the source structure 400 may be electrically connected to the first conductive layer 701, and the drain structure 500 may be electrically connected to the second conductive layer 702. In addition, in some embodiments, the first conductive layer 701 may be electrically grounded.

Moreover, it should be understood that, in the drawing, the line segments connected between the source metal layer 403 and the first conductive layer 701, and between the drain metal layer 503 and the second conductive layer 702 are schematically illustrated to represent their electrical connection relationships. However, the line segments therebetween do not mean that they must be connected by wires. In accordance with some embodiments of the present disclosure, the positional arrangement of the aforementioned elements is not limited to those shown in the drawings.

In some embodiments, the material of the gate electrode 301 may include a conductive material, such as a metal, a metal nitride, or a semiconductor material. In some embodiments, the metal may include gold (Au), nickel (Ni), platinum (Pt), palladium (Pd), iridium (Ir), titanium (Ti), chromium (Cr), tungsten (W), aluminum (Al), copper (Cu), other suitable conductive materials, or a combination thereof. In some embodiments, the semiconductor material may include polycrystalline silicon or polycrystalline germanium. In some embodiments, for example, a chemical vapor deposition (CVD) process, a sputtering process, a resistive thermal evaporation process, an electron beam evaporation process, or other suitable processes may be used to form the aforementioned conductive material on the barrier layer 233, and then a patterning process may be performed on the conductive material to the form the gate electrode 301.

In accordance with some embodiments, before the gate electrode 301 is formed, the doped compound semiconductor layer 234 may be formed on the barrier layer 233, and then the gate electrode 301 may be formed on the doped compound semiconductor layer 234. By providing the doped compound semiconductor layer 234 between the gate electrode 301 and the barrier layer 233, the generation of two-dimensional electron gas (2DEG) under the gate electrode 301 may be suppressed to achieve the normally-off state of the semiconductor structure 100D. In some embodiments, the material of the doped compound semiconductor layer 234 may include p-doped or n-doped gallium nitride (GaN). In some embodiments, an epitaxial growth process may be used to deposit a doped compound semiconductor material on the barrier layer 233 and then a patterning process may be performed to form the doped compound semiconductor layer 234, which corresponds to the predetermined location of forming the gate electrode 301.

In some embodiments, the thickness of the doped compound semiconductor layer 234 may be in a range from about 50 nanometers to about 250 nanometers, for example, about 80 nanometers, but the present disclosure is not limited thereto.

In some embodiments, the materials of the source electrode 401 and the drain electrode 501 that are formed on both sides of the gate electrode 301 may be similar to that of the gate electrode 301, and thus will not be repeated herein.

In some embodiments, the gate metal layer 302, the source contact 402, the source metal layer 403, the drain contact 502, and the drain metal layer 503 may be formed by a deposition process and a patterning process. Furthermore, the materials of the gate metal layer 302, the source contact 402, the source metal layer 403, the drain contact 502, and the drain metal layer 503 may include conductive materials. For example, in some embodiments, the conductive material may include aluminum (Al), copper (Cu), tungsten (W), titanium (Ti), tantalum (Ta), titanium nitride (TiN), tantalum nitride (TaN), nickel silicide (NiSi), cobalt silicide (CoSi), tantalum carbide (TaC), tantalum silicide nitride (TaSiN), tantalum carbide nitride (TaCN), titanium aluminide (TiAl), titanium aluminide nitride (TiAlN), metal oxide, metal alloy, other suitable conductive materials, or a combination thereof.

In accordance with some embodiments, as shown in FIG. 1, the gate electrode 301 may be buried in the first dielectric layer 240, and the gate metal layer 302 may be buried in the first dielectric layer 240 and the second dielectric layer 250. In some embodiments, the source electrode 401 may contact the channel layer 232 through the barrier layer 233, and the source contact 402 may contact the source electrode 401 through the first dielectric layer 240 and the second dielectric layer 250. The source metal layer 403 may be disposed on the first dielectric layer 240 and the second dielectric layer 250 and electrically connected to the source contact 402. In some embodiments, the drain electrode 501 may contact the channel layer 232 through the barrier layer 233, and the drain contact 502 may contact the drain electrode 501 through the first dielectric layer 240 and the second dielectric layer 250. The drain metal layer 503 may be disposed on the first dielectric layer 240 and the second dielectric layer 250 and electrically connected to the drain contact 502.

In some embodiments, the first dielectric layer 240 and the second dielectric layer 250 may include one or more single-layer or multi-layer dielectric materials, for example, silicon oxide, silicon nitride, silicon oxynitride, tetraethoxysilane (TEOS), phosphosilicate glass (PSG), borophosphosilicate glass (BPSG), low dielectric constant dielectric materials, other suitable dielectric materials, or a combination thereof. The low dielectric constant dielectric materials may include fluorinated silica glass (FSG), hydrogen silsesquioxane (HSQ), carbon-doped silicon oxide, amorphous carbon fluoride (fluorinated carbon), parylene, bis-benzocyclobutenes (BCB) or polyimide. For example, in some embodiments, a spin coating process, a chemical vapor deposition (CVD) process, a physical vapor deposition (PVD) process, an atomic layer deposition (ALD) process, a high-density plasma chemical vapor deposition (HDPCVD) process, other suitable processes, or a combination thereof may be used to deposit the aforementioned dielectric material on the compound semiconductor layer 230 (e.g., the barrier layer 233) to form the first dielectric layer 240 and the second dielectric layer 250.

In some embodiments, the thickness of the first dielectric layer 240 may be in a range from about 2 nanometers to about 500 nanometers, for example, about 300 nanometers, but the present disclosure is not limited thereto. In some embodiments, the thickness of the second dielectric layer 250 may be in a range from about 2 nanometers to about 500 nanometers, for example, about 300 nanometers, but the present disclosure is not limited thereto.

As shown in FIG. 1, the conductive paste 600 may be disposed between the base 200 and the lead frame 700, and the conductive paste 600 may extend on the side surface 200s of the base 200 and the side surface 210s of the buried oxide layer 210. In some embodiments, the conductive paste 600 may be in contact with the first conductive layer 701 of the lead frame 700, the base 200 and the buried oxide layer 210. It should be noted that in accordance with some embodiments, since the first conductive layer 701 of the lead frame 700 is electrically grounded, the conductive paste 600 can guide the charges accumulated in the base 200 and the buried oxide layer 210 to the lead frame 700 for grounding. This can reduce the capacitance between the seed layer 220 and the lead frame 700.

In some embodiments, the conductive paste 600 may partially or entirely cover the side surface 200s of the base 200. In some embodiments, the conductive paste 600 may partially or entirely cover the side surface 210s of the buried oxide layer 210. In some embodiments, the height of the conductive paste 600 may be lower than the height of the top surface 200t of the base 200. In some embodiments, the height of the conductive paste 600 may be higher than the height of the top surface 200t of the base 200 and lower than the height of the top surface 210t of the buried oxide layer 210. In some other embodiments, the height of the conductive paste 600 may be substantially the same as the height of the top surface 210t of the buried oxide layer 210, that is, the conductive paste 600 may be substantially aligned with the buried oxide layer 210.

It should be understood that although the conductive paste 600 extends to both side surfaces of the base 200 and the buried oxide layer 210 in the embodiment shown in FIG. 1, the conductive paste 600 may be partially or entirely disposed on a single side surface of the base 200 and the buried oxide layer 210 in accordance with some other embodiments. Alternatively, the conductive paste 600 may be disposed on a suitable number of side surfaces of the base 200 and the buried oxide layer 210 according to needs. Specifically, in accordance with some embodiments, for example, the semiconductor structure 100D has four side surfaces, the conductive paste 600 may be disposed on one, two, three, or four side surfaces of the base 200 and the buried oxide layer 210. In some embodiments, the base 200 and the buried oxide layer 210 may be entirely surrounded and encircled by the conductive paste 600.

In some embodiments, the material of the conductive paste 600 may include a polymer matrix and conductive particles dispersed in the polymer matrix. In some embodiments, the polymer matrix may include an acrylic resin such as polymethylmetacrylate (PMMA), epoxy resin, silicone, maleic anhydride, other suitable matrix materials, or a combination thereof. In some embodiments, the material of the conductive particle may include silver (Ag), copper (Cu), gold (Au), aluminum (Al), nickel (Ni), carbon (C), other suitable conductive materials, or a combination thereof. For example, in some embodiments, the conductive paste 600 may be formed by a coating process, a printing process, or other suitable processes.

Figure 2:
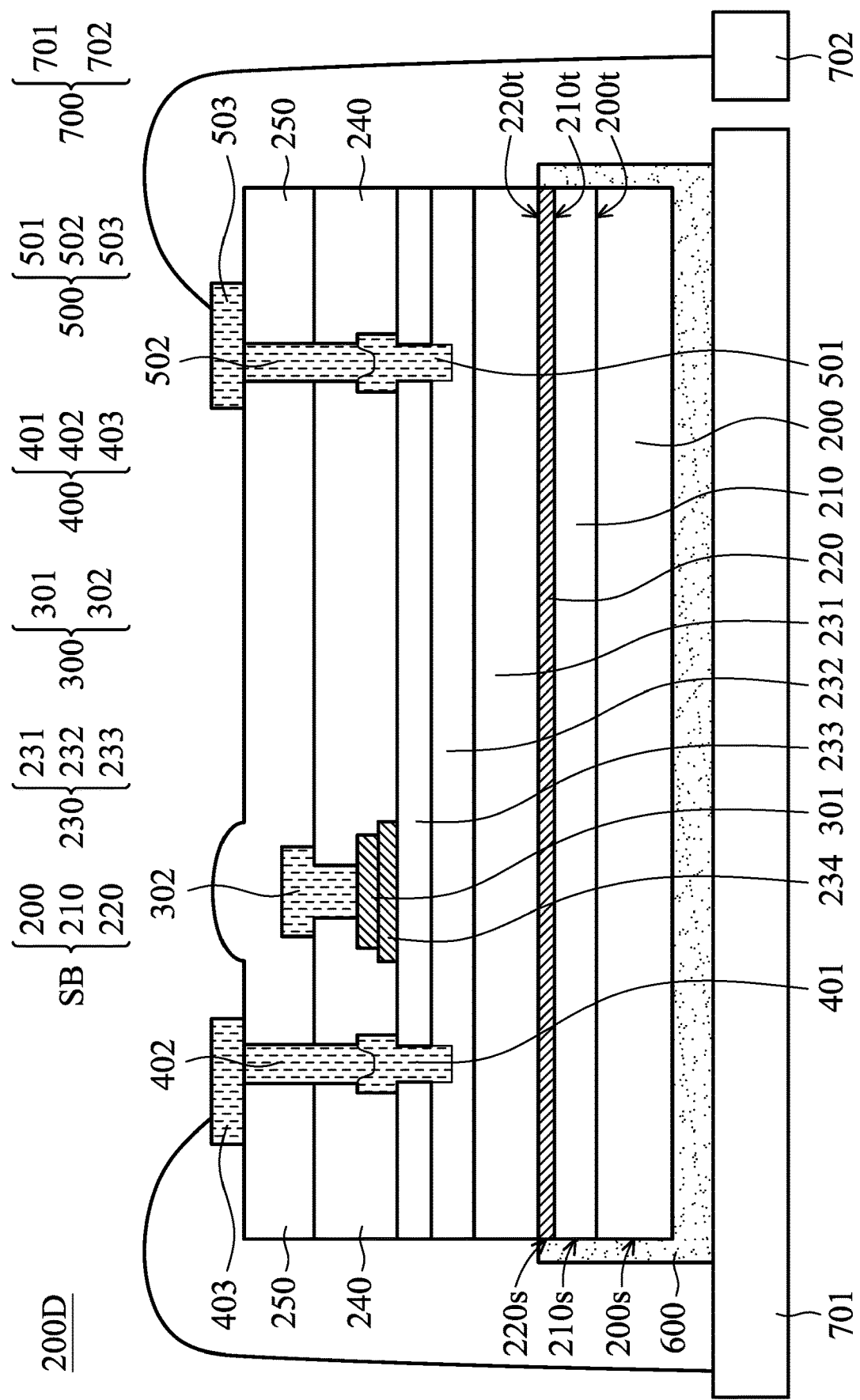
FIG. 2 is a cross-sectional diagram of a semiconductor structure in accordance with some other embodiments of the present disclosure.

Next, refer to FIG. 2, which is a cross-sectional diagram of a semiconductor structure 200D in accordance with some other embodiments of the present disclosure. It should be understood that the same or similar components or elements in above and below contexts are represented by the same or similar reference numerals. The materials, manufacturing methods and functions of these components or elements are the same or similar to those described above, and thus will not be repeated herein.

As shown in FIG. 2, in accordance with some embodiments, the conductive paste 600 may further extend on the side surface 220s of the seed layer 220. In other words, in some embodiments, the conductive paste 600 may be in contact with the first conductive layer 701 of the lead frame 700, the base 200, the buried oxide layer 210, and the seed layer 220. In some embodiments, the seed layer 220 may be electrically connected to the first conductive layer 701 of the lead frame 700 through the conductive paste 600. It should be noted that in accordance with some embodiments, since the first conductive layer 701 of the lead frame 700 is electrically grounded, the conductive paste 600 can guide the charges accumulated in the seed layer 220 to the lead frame 700 for grounding. This can reduce the capacitance value between the seed layer 220 and the lead frame 700, and therefore can improve the operation stability of the semiconductor structure 200D. In addition, the configuration described above can also reduce the occurrence of lateral leakage current in the seed layer 220 and improve the heat dissipation effect of the semiconductor structure 200D.

In some embodiments, the conductive paste 600 may partially or entirely cover the side surface 220s of the seed layer 220. In some embodiments, the height of the conductive paste 600 may be higher than the height of the top surface 210t of the buried oxide layer 210 and lower than the height of the top surface 220t of the seed layer 220. In other embodiments, the height of the conductive paste 600 may be substantially the same as the height of the top surface 220t of the seed layer 220, that is, the conductive paste 600 may be substantially aligned with the seed layer 220.

Furthermore, as mentioned above, in accordance with some embodiments, the conductive paste 600 may be partially or entirely disposed on a single side surface of the seed layer 220, or may be disposed on a suitable number of side surfaces of the seed layers 220 according to needs. In some embodiments, the seed layer 220 may be entirely surrounded and encircled by the conductive paste 600.

Figure 3:
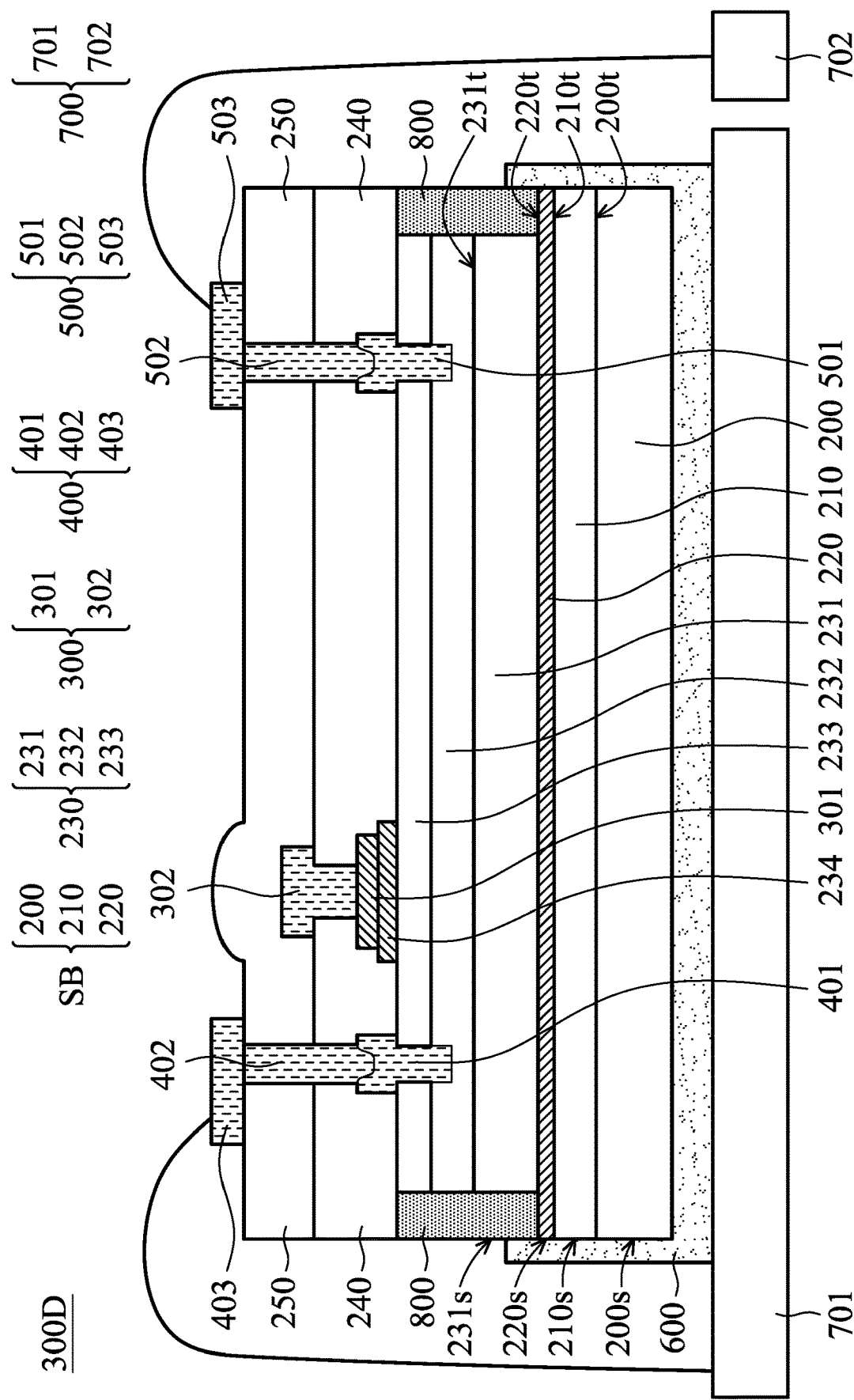
FIG. 3 is a cross-sectional diagram of a semiconductor structure in accordance with some other embodiments of the present disclosure.

Next, refer to FIG. 3, which is a cross-sectional diagram of a semiconductor structure 300D in accordance with some other embodiments of the present disclosure. As shown in FIG. 3, in accordance with some embodiments, the conductive paste 600 may further extend on the side surface of the compound semiconductor layer 230, i.e. the side surface of the buffer layer 231, the channel layer 232, or the barrier layer 233. In addition, there may be an isolation structure 800 between the conductive paste 600 and the side surface 230S of the compound semiconductor layer 230. For example, the isolation structure 800 may be located on at least opposite sides of the compound semiconductor layer 230. For example, as shown in FIG. 3, the conductive paste 600 may extend on the side surface 231s of the buffer layer 231. In some embodiments, the isolation structure 800 may exist between the conductive paste 600 and the side surface 231s of the buffer layer 231. For example, the isolation structure 800 may be located at least on opposite sides of the buffer layer 231. The isolation structure 800 may be formed by, for example, applying external energy to damage the buffer layer 231, the channel layer 232 or the barrier layer 233, or implanting non-conductive elements in the buffer layer 231, the channel layer 232 or the barrier layer 233, or filling an insulating material in the buffer layer 231, the channel layer 232 or the barrier layer 233. The isolation structure 800 can prevent lateral leakage of the compound semiconductor layer 230. In other words, in some embodiments, the conductive paste 600 may be in contact with the first conductive layer 701 of the lead frame 700, the base 200, the buried oxide layer 210, the seed layer 220, and the compound semiconductor layer 230. In some embodiments, the compound semiconductor layer 230 may be electrically connected to the first conductive layer 701 of the lead frame 700 through the conductive paste 600. It should be noted that in accordance with some embodiments, since the first conductive layer 701 of the lead frame 700 is electrically grounded, the conductive paste 600 can guide the charges accumulated in the compound semiconductor layer 230 to the lead frame 700 for grounding, thereby improving the operational stability of the semiconductor structure 300D. In addition, the configuration described above can also reduce the occurrence of lateral leakage current in the compound semiconductor layer 230 and improve the heat dissipation effect of the semiconductor structure 300D.

In some embodiments, the conductive paste 600 may partially or entirely cover the side surface 231s of the buffer layer 231 of the compound semiconductor layer 230. In some embodiments, the height of the conductive paste 600 may be higher than the height of the top surface 220t of the seed layer 220 and lower than the height of the top surface 231t of the buffer layer 231. In some other embodiments, the height of the conductive paste 600 may be substantially the same as the height of the top surface 231t of the buffer layer 231, that is, the conductive paste 600 may be substantially aligned with the buffer layer 231.

Furthermore, as mentioned above, in accordance with some embodiments, the conductive paste 600 may be partially or entirely disposed on a single side surface of the buffer layer 231, or may be disposed on a suitable number of side surfaces of the buffer layer 231 according to needs. In some embodiments, the buffer layer 231 may be entirely surrounded and encircled by the conductive paste 600.

The semiconductor structure provided in the embodiments of the present disclosure includes the conductive paste extending on and in contact with the side surface of the semiconductor structure (e.g., the side surfaces of the base, the buried oxide layer, and/or the seed layer, and/or the compound semiconductor layer). Such a configuration can reduce the capacitance of the bottom of the substrate, and render the seed layer electrically grounded, thereby improving the operational stability of the semiconductor structure. In addition, in accordance with some embodiments of the present disclosure, the provided semiconductor structure includes the base, but a via penetrating through the compound semiconductor layer may not be provided. That is, the front side of substrate may not be used for electrical grounding, and the backside of substrate may still be used for electrically grounding so as to increase the breakdown voltage of the semiconductor structure and reduce the risk of lateral leakage current.

Although some embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the claimed scope of the present disclosure also includes the combinations of the claims and embodiments. The scope of protection of present disclosure is subject to the definition of the scope of the appended claims.

What is claimed is:

1. A semiconductor structure, comprising:
    a substrate comprising a base, a buried oxide layer and a seed layer, and the buried oxide layer is disposed between the base and the seed layer;
    a compound semiconductor layer disposed on the seed layer;
    a gate structure disposed on the compound semiconductor layer;
    a source structure and a drain structure disposed on both sides of the gate structure; and
    a conductive paste disposed between the substrate and a lead frame, and the conductive paste extends to a side surface of the buried oxide layer.

2. The semiconductor structure as claimed in claim 1, wherein the conductive paste is in contact with the lead frame and the substrate.

3. The semiconductor structure as claimed in claim 1, wherein the conductive paste further extends to a side surface of the seed layer.

4. The semiconductor structure as claimed in claim 3, wherein the seed layer is electrically connected to the lead frame through the conductive paste.

5. The semiconductor structure as claimed in claim 4, wherein the lead frame is electrically grounded.

6. The semiconductor structure as claimed in claim 3, wherein the conductive paste further extends to a side surface of the compound semiconductor layer.

7. The semiconductor structure as claimed in claim 6, wherein there is an isolation structure between the conductive paste and the side surface of the compound semiconductor layer.

8. The semiconductor structure as claimed in claim 6, wherein the conductive paste further extends to a side surface of a buffer layer.

9. The semiconductor structure as claimed in claim 8, wherein there is an isolation structure between the conductive paste and the side surface of the buffer layer.

10. The semiconductor structure as claimed in claim 1, wherein the lead frame comprises a first conductive layer and a second conductive layer, wherein the seed layer and the source structure are electrically connected to the first conductive layer, and the first conductive layer is electrically grounded.

11. The semiconductor structure as claimed in claim 10, wherein the drain structure is electrically connected to the second conductive layer.

12. The semiconductor structure as claimed in claim 1, wherein the compound semiconductor layer comprises:
    a buffer layer disposed on the seed layer;
    a channel layer disposed on the buffer layer; and
    a barrier layer disposed on the channel layer.

13. The semiconductor structure as claimed in claim 12, wherein the gate structure comprises:
    a gate electrode layer disposed on the barrier layer; and
    a gate metal layer disposed on the gate electrode layer and electrically connected to the gate electrode layer.

14. The semiconductor structure as claimed in claim 12, further comprising a dielectric layer disposed on the compound semiconductor layer.

15. The semiconductor structure as claimed in claim 14, wherein the source structure comprises:
    a source electrode contacting the channel layer through the barrier layer;
    a source contact that contacts the source electrode through the dielectric layer; and
    a source metal layer disposed on the dielectric layer and electrically connected to the source contact;
    and wherein the drain structure comprises:
    a drain electrode that contacts the channel layer through the barrier layer;
    a drain contact that contacts the drain electrode through the dielectric layer; and
    a drain metal layer disposed on the dielectric layer and electrically connected to the drain contact.

16. The semiconductor structure as claimed in claim 1, wherein the base comprises a ceramic substrate or a silicon substrate.

17. The semiconductor structure as claimed in claim 16, wherein the material of the ceramic substrate comprises aluminum nitride (AlN), silicon carbide (SiC), aluminum oxide ($Al_2O_3$), or a combination thereof.

18. The semiconductor structure as claimed in claim 1, wherein the material of the seed layer comprises silicon (Si), silicon carbide, aluminum nitride, or a combination thereof.

19. The semiconductor structure as claimed in claim 1, wherein the material of the conductive paste comprises a conductive particle, and the material of the conductive particle comprises silver, copper, gold, aluminum, nickel, carbon, or a combination thereof, and wherein the compound semiconductor layer is a gallium nitride-based semiconductor layer.

20. The semiconductor structure as claimed in claim 1, wherein the compound semiconductor layer comprises a gallium nitride-based semiconductor layer or an aluminum nitride-based layer.

* * * * *